United States Patent [19]
Baker

[11] 4,310,801
[45] Jan. 12, 1982

[54] PROGRAMMABLE DIVIDER

[75] Inventor: John D. Baker, Lisle, Ill.

[73] Assignee: Stewart-Warner Corporation, Chicago, Ill.

[21] Appl. No.: 39,376

[22] Filed: May 16, 1979

Related U.S. Application Data

[62] Division of Ser. No. 781,205, Mar. 25, 1977, Pat. No. 4,167,699.

[51] Int. Cl.³ .................................................. H03K 21/36
[52] U.S. Cl. ........................................ 328/48; 328/46; 328/61; 235/92 PE; 307/224 C
[58] Field of Search .................... 328/48, 49, 61, 63; 235/92 PE; 307/205, 224 C

[56] References Cited

U.S. PATENT DOCUMENTS

| | | | |
|---|---|---|---|
| 3,383,525 | 5/1968 | Arksey | 328/48 X |
| 3,646,329 | 2/1972 | Yoshino et al. | 307/205 |
| 3,863,224 | 1/1975 | Alexander | 328/48 X |
| 4,009,445 | 2/1977 | Hasegawa | 328/49 |
| 4,021,794 | 5/1977 | Carlson | 328/48 X |

*Primary Examiner*—John S. Heyman
*Attorney, Agent, or Firm*—McDougall, Hersh & Scott

[57] ABSTRACT

A programmable divider is provided for dividing the frequency of an input signal by a selectable integer. The divider includes a multiple stage ripple counter, a transmission gate coupled between each stage of the ripple counter and a means for producing an output signal, and a means for selectively enabling each transmission gate.

7 Claims, 1 Drawing Figure

PROGRAMMABLE DIVIDER

／

PROGRAMMABLE DIVIDER

This application is a division of Ser. No. 781,205, filed Mar. 25, 1977, entitled "User Calibrated Electronic Speedometer and Odometer", which issued as U.S. Pat. No. 4,167,699 on Sept. 11, 1979.

BACKGROUND OF THE INVENTION

This invention relates to the field of divider circuits. More particularly, it relates to programmable divider circuits particularly but not exclusively suitable for use with display gauges, such as those utilized for displaying engine speed (tachometers), ground speed (speedometers), and distance travelled (odometers). Typically, such gauges are required on motor vehicles including passenger cars, trucks and tractors. Such gauges are important, particularly for trucks and tractors, where lease rates, service intervals and the like are dependent upon mileage while tractors must precisely monitor their ground speed to assure accurate placement of seeds during plowing.

In the past a substantial problem has existed with trucks and tractors when the gearing was changed as, for example, when a truck is in overdrive or when the tire size of a vehicle changes. Electronic measuring devices typically receive their input signals as a series of pulses from the wheel or drive shaft depending upon the condition being sensed. Changing the gear ratio of the final drive of a truck or changing the tire size on the wheels of the vehicle alters the calibration of the speedometer and odometer rendering them inaccurate until re-calibrated. Presently, regardless of the type of instrument employed, re-calibration has been an expensive and time consuming process whereby a skilled mechanic is required to adjust the device for the new operating parameters of tire size or gear ratio.

With respect to the re-calibration necessary for tire size changes and the like, the programmable divider of this invention can be programmed simply by inserting a properly coded key element into a receptacle. The coded key selects the dividing ratio of the programmable divider to account for changes in the condition to be measured.

It is an object of the present invention to provide a programmable divider which can be set by a user to a selected value depending upon the application.

Other objects and advantages of the invention will be apparent from the remaining portion of the specification.

DETAILED DESCRIPTION

Figure 1:
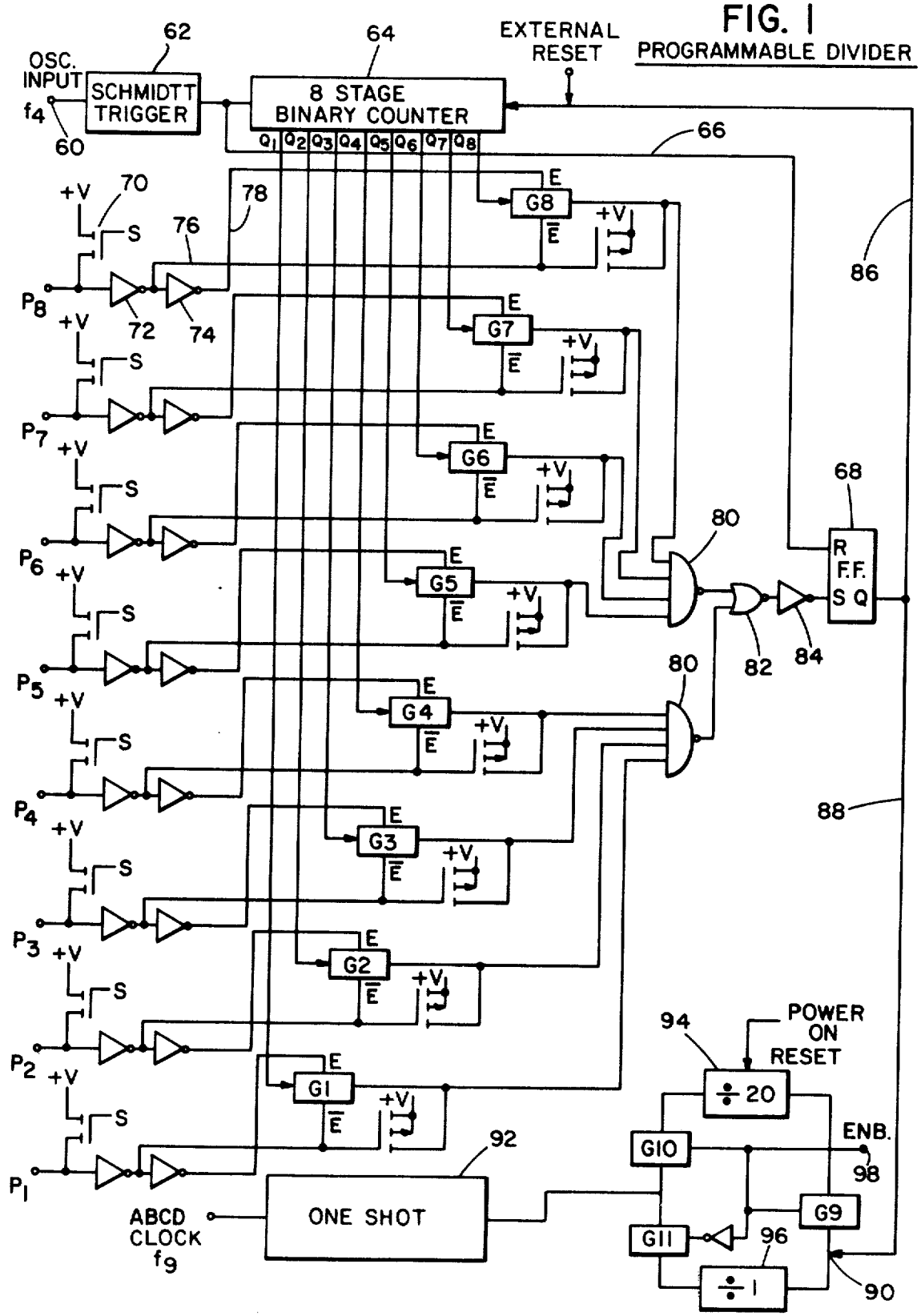
FIG. 1 is a schematic of the programmable divider according to the present invention.

The programmable divider of FIG. 1 is preset to a desired value by means of the programmable pins P1 through P8. Selected ones of these pins are connected to signal ground. These pins may be connected to a multiple pin receptacle which receives a mating mechanical key provided with a plurality of removable teeth for grounding selected pins.

Referring to FIG. 1, the programmable divider according to a preferred embodiment of the invention is illustrated. The input from an oscillator is received at terminal 60 where it is shaped and squared by Schmidt trigger 62. The output of the Schmidt trigger circuit is provided to an eight stage binary counter 64 and via line 66 to the reset input of flip flop 68. The outputs of the eight stage binary counter, designated Q1 through Q8, are provided to a matrix of bi-lateral transmission gate switches designated G1 through G8. These switches are of a commercially available type, such as those manufactured by RCA under the designation CD4016. These switches, sometimes referred to as transmission gates, permit an input to pass through to an output line whenever the control lines associated therewith are enabled. In this application gates 1 through 8 have the outputs of the binary counter 64 applied thereto as the signal input. The control lines carrying the designation E and $\bar{E}$ are connected to the programming terminals P1 through P8 via a pull up "P channel" field effect transistor and two logic inverters for operating the associated transmission gate. Thus, for example, terminal P8 employs transistor 70 and logic inverters 72 and 74 for operating the control lines 76 and 78 associated with gate G8. Thus, when terminal P8 is grounded the transmission gate G8 will permit an output on line Q8 of the binary counter to pass through to the upper NAND gate 80. A similar statement is true for gates G1 through 7 and programmable inputs P1 through 7. The output of the NAND gates 80 is provided to NOR gate 82 and via inverter 84 to the set input of flip flop 68. The Q output of flip flop 68 is provided via line 86 to the reset input of the binary ripple counter and via line 88 to terminal 90. At terminal 90, depending upon which of transmission gates G9, G10 and G11 are operated, the output will be divided by one or by 20 and then applied to trigger a one shot 92. The output of the one shot 92 is the ABCD CLOCK signal F9.

Operation of the circuit of FIG. 1 should be apparent from the foregoing description. However, a brief review is believed useful. Depending upon the vehicle to which the system is installed, a proper divisor is selected and programmed into the circuit of FIG. 1. For example, the programmable divider may be set to divide by 192. Thus, for every 192 oscillator pulses one pulse will be produced from the programmable divider. In order to program the divider to divide by 192, inputs P7 and P8 would be grounded. Grounding these pins permits the output Q7 and Q8 to pass transmission gates G7 and G8 and operate the flip flop 68. Since binary counter 64 is a ripple counter each of its outputs Q1 through Q8 represents a corresponding power of two, that is, Q1 represents $2^0$, Q2 represents $2^1$ while Q8 which represents $2^7 = 128$. By grounding pins P7 and P8 the flip flop 68 will be set only when the eight stage binary counter has a count of Q7+Q8(128+64=192). It will be apparent that all inputs to the gates 80 are at a logical one except for the inputs corresponding to pins that are grounded. If P7 and P8 are grounded then the G7 and G8 inputs to the NAND gate 80 will be low until the counter 64 reaches 192. The gate 80 then sets flip flop 68. Other divisor values are selected by changing the pins which are grounded. It will be readily apparent, therefore, that the programmable divider illustrated in FIG. 1 is capable of division by any selected integer from 1 through 255 plus the added capability of the divide by 20 circuit 94.

The output from the flip flop 68 is used to reset the binary counter 64 in preparation for another cycle of operation and also to trigger one shot 92 via the divide by 20 circuit 94 or the divide by 1 circuit 96 as required for a given application. The value of the signal on terminal 98 determines which of the divider circuits 94 and 96 passes the signal to the one shot 92.

While I have shown and described embodiments of this invention in some detail, it will be understood that this description and illustrations are offered merely by way of example, and that the invention is to be limited in scope only by the appended claims.

I claim:

1. A divider for dividing the frequency of an input signal by a selectable integer to produce an output signal comprising:
    (a) a multiple stage ripple counter incremented by said input signal and having an output for each stage thereof,
    (b) means selectively enabled to gate the output of each stage of said counter to a producing means, said gating means comprising a separate transmission gate coupled between the output of each stage and the producing means for transmitting, when enabled, the output of each stage to the producing means independent of the state of the output of any stage,
    (c) means for enabling selected ones of said transmission gates, the value of said integer being determined by selecting which of said transmission gates are enabled,
    (d) means for producing said output signal only when an output is received from all counter stages whose corresponding gating means have been enabled.

2. The divider circuit according to claim 1 further including
    a one shot multivibrator receiving said output signal and producing a further signal, the duration of which is a function of the values of the timing resistor and capacitor associated with said multivibrator.

3. The divider circuit according to claim 1 wherein said ripple counter has at least eight stages.

4. The divider circuit according to claim 1 wherein said counter is an eight stage binary ripple counter.

5. The divider circuit according to claim 1 further including means for resetting said counter each time an output signal is produced by said producing means.

6. The divider circuit according to claim 1 wherein said enabling means includes:
    (a) a program input terminal for each gating means,
    (b) means for connecting each of said program input terminals to one of two voltage levels, one of said levels enabling said gating means.

7. The divider circuit according to claim 1 wherein said enabling means includes:
    (a) a program input terminal for each of said transmission gates,
    (b) means for detecting the voltage level applied to each of said terminals and for operating the control lines of said transmission gates if a first voltage level is present at said input terminals and inhibiting said switch control lines if a second voltage level is present.

* * * * *